United States Patent [19]

Mack

[11] Patent Number: 5,599,616
[45] Date of Patent: Feb. 4, 1997

[54] LAMINAR IMAGING MEDIUM UTILIZING CROSS-LINKED BORATED POLYMERIC BINDER

[75] Inventor: Jonathan M. Mack, Boylston, Mass.

[73] Assignee: Polaroid Corporation, Cambridge, Mass.

[21] Appl. No.: 347,598

[22] Filed: Nov. 30, 1994

[51] Int. Cl.⁶ .................. B32B 3/26; G03F 7/004
[52] U.S. Cl. ............ 428/304.4; 428/195; 428/206; 428/520; 428/704; 428/913; 430/200; 430/253; 430/254; 430/257; 430/260; 430/291; 430/330; 430/945
[58] Field of Search ...................... 428/195, 206, 428/304.4, 520, 704, 913; 430/200, 253, 254, 257, 260, 291, 330, 945

[56] References Cited

U.S. PATENT DOCUMENTS

| | | | |
|---|---|---|---|
| Re. 23,297 | 11/1950 | Hyman et al. ............... | 88/65 |
| 3,881,932 | 5/1975 | Young ................... | 96/76 R |
| 4,123,578 | 10/1978 | Perrington et al. ............. | 428/206 |
| 4,231,829 | 11/1980 | Marui et al. ................ | 156/230 |
| 4,427,758 | 1/1984 | Quinn ..................... | 430/271 |
| 4,742,041 | 5/1988 | Ikeda et al. ................ | 503/200 |
| 5,200,297 | 4/1993 | Kelly ..................... | 430/253 |
| 5,225,314 | 7/1993 | Waterman et al. ............ | 430/253 |
| 5,286,703 | 2/1994 | Wachi et al. ............... | 503/221 |
| 5,317,002 | 5/1994 | Onishi .................... | 503/227 |

OTHER PUBLICATIONS

PCT International Search Report for PCT/US95/15526 (Forms PCT/ISA/210 and 220) (mailed Mar. 15, 1996).

*Primary Examiner*—Bruce H. Hess
*Attorney, Agent, or Firm*—Renato M. de Luna

[57] ABSTRACT

A peel-developable imaging medium for the imagewise recordation of information is provided, the imaging medium having therein a plurality of fracturable layers, the plurality comprising a porous or particulate image-forming layer and a release layer, and at least one of the fracturable layers having incorporated therein a boric ion generating species. In particular embodiments, the fracturable layers contain crosslinked borated polymeric binder. The laminar imaging medium is characterized by good imaging performance in an extended range of environmental conditions.

11 Claims, 1 Drawing Sheet

LAMINAR IMAGING MEDIUM UTILIZING CROSS-LINKED BORATED POLYMERIC BINDER

FIELD OF THE INVENTION

The present invention is directed to a laminar imaging medium for the imagewise recordation of information, the recorded latent image being developable by laminar separation. More particularly, embodiments of the present invention are directed to a laminar imaging medium having at least one fracturable layer having therein a cross-linked borated polymeric binder, the medium being characterized by broad environmental performance and good imaging performance.

BACKGROUND OF THE INVENTION

Imaging media whereby a recorded latent image is developed by laminar separation are known. Among such imaging media, the provision of images which rely upon the generation of heat patterns is also known. Thermally imageable media are particularly advantageous inasmuch as they can be imaged without certain of the requirements attending the use of silver halide based media, such as darkroom processing and protection against ambient light. Moreover, the use of thermal imaging materials avoids the requirements of handling and disposing of silver-containing and other processing streams or effluent materials typically associated with the processing of silver halide based imaging materials.

Various methods and systems for preparing actinically generated symbols, patterns, or other images have been reported, said methods and systems involving laminar separation to effect development. Examples of these can be found in U.S. Pat. No. 4,169,731 (issued Oct. 2, 1979 to Noshiro et at.); in U.S. Pat. No. 4,581,308 (issued Apr. 8, 1986 to Moriya et al.); in U.S. Pat. No. 4,271,255 (issued Jun. 2, 1981 to Cho et al.); in U.S. Pat. No. 4,511,641 (issued Apr. 6, 1985 to Busman et al.); in U.S. Pat. No. 4,963,462 (issued Oct. 16, 1990 to Wilczak et al.); in U.S. Pat. No. 4,356,251 (issued Oct. 26, 1982 to Cohen et al.); in U.S. Pat. No. 4,489,153 (issued Dec. 18, 1984 to Ashcraft et al.); in U.S. Pat. No. 4,489,154 (issued Dec. 18, 1984 to Taylor, Jr.); in U.S. Pat. No. 4,123,578 (issued Oct. 31, 1978 to K. J. Perrington, et al.); in U.S. Pat. No. 4,157,412 (issued Jun. 5, 1979 to K. S. Deneau); and in International Patent Application No. PCT/US87/03249 of M. R. Etzel (published Jun. 16, 1988, as Intentional Publication Number WO 88/04237).

In the aforementioned International Patent Application No. PCT/US87/03249, there are described certain embodiments of a high resolution thermal imaging medium, which embodiments include a porous or particulate image-forming substance (e.g., a layer of pigment and binder) confined in a laminar structure between a pair of sheets. Upon laminar separation of the respective sheets, after laser exposure of portions or regions of the medium, a pair of complementary images is obtained. Among the laminar embodiments discussed in International Patent Application No. PCT/US87/03249 are those which include: a first sheet transparent to image-forming radiation and having at least a surface zone or layer of polymeric material which is heat-activatable upon subjection of the medium to brief and intense radiation; a layer of porous or particulate image-forming substance thereon; and a second sheet laminated and adhesively secured to the first sheet.

Upon exposure of regions or portions of the medium to brief and intense image-forming radiation, and conversion of absorbed energy to heat for activation of the heat-activatable polymeric material, corresponding regions or portions of the image-forming substance are caused m be more firmly attached or "locked" to the first sheet. Laminar separation of the sheet then effects fracturing of the image-forming layer in response to cohesive and/or adhesive failure. Abutting regions or portions of image-forming substance which are not subjected to such image-forming radiation are, upon separation of the first and second sheets, removed by the adhesive second sheet, for formation of an image complementary to the image on the first sheet.

The respective images obtained by separating the sheets of the exposed thermal imaging medium may exhibit substantially different characteristics. Apart from the imagewise complementary nature of these images and the relation that each may bear as a "positive" or "negative" of an original, the respective images may differ in character. Differences may depend upon the properties of the image-forming substance, on the presence of and nature of additional layer(s) in the medium, and upon the manner in which such layers fail adhesively or cohesively upon separation of the sheets. Either of the pair of images may, for reasons of informational content, aesthetics or otherwise, be desirably considered the principal image.

As described in the International Patent Application (and, e.g., U.S. Pat. Nos. 5,155,003 and 5,200,297), the image-forming layer may comprise image-forming substances (e.g., carbon black particles) and a hydrophilic binder (e.g., polyvinyl alcohol). According to one practice, carbon black particles are initially suspended in an inert liquid vehicle (typically, water) and the resulting suspension or dispersion uniformly spread over an underlying layer.

In the aforementioned International Patent Application, mention is made of particular embodiments comprising a release layer overlying the image-forming layer. As disclosed, the fracturable release layer comprises a microcrystalline wax. Subsequent patents, e.g., U.S. Pat. No. 5,155,003, issued to K. C. Chang on Oct. 13, 1993, and U.S. Pat. No. 5,200,297, issued to N. F. Kelly on Apr. 6, 1993, suggest the incorporation into a release layer of particulate materials (such as silica, day particles, and particles of polytetrafluoroethylene) and binding agents. Laminar separation of such medium will effect the fracturing of the image-forming layer and release layer in response to cohesive and/or adhesive failure, the failure being attributable to either of the two layers. It will be appreciated that, in general, adhesivity and cohesivity will oftentimes be affected by ambient environmental conditions.

While good results are obtained from the aforedescribed embodiments, a desire has developed to improve fracturing of the medium's fracturable layers and thereby enhance imaging performance. A desire has also developed to extend the performance of such media across a wider range of environmental conditions without departing from good imaging performance. 0f particular interest is the realization of such performance under varying environmental conditions, for example, under tropical (i.e., hot and humid) and arid (i.e., hot and dry) conditions, these conditions being foreseeably encountered when such media are transported, stored, and/or used during imaging and development. Advantage may be derived from reduced implementation of environmentally-insulating packaging, transportation, and storage, as well as by ameliorating the affects on imaging of environmental conditions.

SUMMARY OF THE INVENTION

While particularly well-suited for laminar imaging media, the subject matter described herein contemplates and enables control of, for example, fracturability and the release strength and peel strength of laminar media in general. Particular laminar media contemplated are those wherein utility is related to the fracturing and separation of peel-separable polymeric layers, these layers typically being relatively hygroscopic and, accordingly, sensitive to ambient atmospheric moisture content (i.e., humidity).

Aside from its broader scope, in a primary application of the herein described subject matter, a peel-developable imaging medium for the imagewise recordation of information is provided, the imaging medium having therein a fracturable release layer and a fracturable porous or particulate image-forming layer; the image-forming layer being deposited from a formulation comprising an image-forming colorant and a hydrophilic binder; the release layer being deposited from a formulation comprising cohesivity-effecting particles and a hydrophilic binder. In the manufacture of the laminar imaging medium, boric acid (or boric ion generating species) is introduced into a fracturable layer together with the polymeric binder and other desired components. With the polymeric binders typically being polyvinyl alcohol resins, the boric acid is believed to effect intra- and intermolecular hydrogen bonding of the hydroxyl groups of the polyvinyl alcohol resins. In a primary embodiment, boric acid is used to crosslink polyvinyl alcohol resins in a fracturable porous or particulate image-forming layer. In another embodiment, boric acid is also used to crosslink polyvinyl alcohol resins in a fracturable release layer.

The use of boric acid to crosslink (or otherwise react with) a polymeric binder contained in a fracturable layer has been observed to effect—among other measurable variables—fracturability, moisture resistance, release strength, and peel strength. Laminar imaging media have been characterized by enhanced environmental performance and good imaging performance.

In light of the above, it is an object of the present invention to provide a laminar imaging medium having good imaging performance under a comparatively broad range of environmental conditions.

It is a further object of the present invention to provide a laminar, peel-developable imaging medium having at least one fracturable layer, the fracturable layer having a crosslinked borated polymeric binder.

It is a further object of the present invention to provide a laminar, peel-developable imaging medium having at least one fracturable layer having incorporated therein a boric ion generating species.

It is a further object of the present invention to provide a laminar, peel-developable imaging medium having a release layer and a porous or particulate image-forming layer, the release layer having a crosslinked borated polymeric binder.

It is a further object of the present invention to provide a laminar, peel-developable imaging medium having a release layer and a porous or particulate image-forming layer, the image-forming layer having crosslinked borated polymeric binders.

It is a further object of the present invention to provide a laminar, peel-developable imaging medium having a release layer and a porous or particulate image-forming layer, the laminar imaging medium having crosslinked borated polymeric binders in both the release layer and the image-forming layer.

It is a further object of the present invention to provide a laminar imaging medium for the imagewise recordation of information, the recorded latent image being developable by laminar separation, said laminar imaging medium comprising: first and second support sheets; an imagewise activatable polymeric layer, the imagewise activatable layer being activatable in response to an imagewise recordation to thereby change said layer's adhesivity to a porous or particulate image-forming layer; a plurality of fracturable layers, the plurality comprising the porous or particulate image-forming layer and a release layer, at least one of the fracturable layers having a crosslinked borated polymeric binder; the porous or particulate image-forming layer disposed on the imagewise activatable layer and forming an interface therewith, the image-forming layer having cohesivity in excess of its adhesivity for the imagewise activatable layer; a release layer disposed on the image-forming layer and forming an interface therewith such that upon laminar separation of the laminar imaging medium following activation of areas of the laminar imaging medium failure occurs in areas corresponding to the imagewise recordation within or at a surface of the release layer; and the first support sheet secured to the imagewise activatable layer and the second support sheet adhered to the face of the release layer remote from the imagewise activatable layer.

It is a further object of the present invention to provide a laminar imaging medium for the imagewise recordation of information, the recorded latent image being developable by laminar separation, said laminar imaging medium comprising: first and second support sheets; an imagewise activatable polymeric layer, the imagewise activatable layer being activatable in response to an imagewise recordation to thereby change said layer's adhesivity to a porous or particulate image-forming layer; a plurality of fracturable layers, the plurality comprising the porous or particulate image-forming layer and a release layer, at least one of the fracturable layers having incorporated therein a boric ion generating species; the porous or particulate image-forming layer disposed on the imagewise activatable layer and forming an interface therewith, the image-forming layer having cohesivity in excess of its adhesivity for the imagewise activatable layer; a release layer disposed on the image-forming layer and forming an interface therewith such that upon laminar separation of the laminar imaging medium following activation of areas of the laminar imaging medium failure occurs in areas corresponding to the imagewise recordation within or at a surface of the release layer; and the first support sheet secured to the imagewise activatable layer and the second support sheet adhered to the face of the release layer remote from the imagewise activatable layer.

These and other objects of the invention, as well as details relating to the practice of several representative embodiments of the invention, will be better appreciated from the following description construed with consideration of the attached drawings.

DETAILED DESCRIPTION OF THE INVENTION

Figure 1:
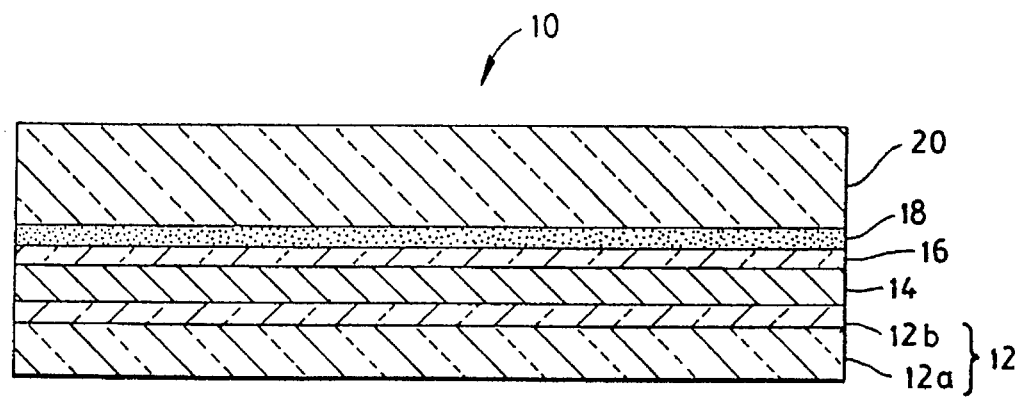
FIG. 1 is a schematic cross-sectional view of a laminar imaging medium according to an embodiment of the present invention.

Embodiments of the present invention are generally directed to a laminar imaging medium for the imagewise recordation of information, the recorded latent image being developable by laminar separation (i.e., peering). The peel-developable imaging medium includes therein at least one fracturable (or "disruptible") layer, said fracturable layer breaking, failing, spritting, or otherwise undergoing like fracturing in response to peeling. In a particular embodiment, the peel-developable imaging medium is provided with a fracturable release layer and a fracturable porous or particulate image-forming layer; the image-forming layer comprising an image-forming colorant and a polymeric binder; the release layer comprising cohesivity-effecting particles and a polymeric binder; the polymeric binder of the image-forming layer and/or the release layer being crosslinked and borated by the use of boric acid or other boric ion generating species.

In accord with an embodiment, boric acid is added into the release layer formulation, the release layer formulation being then integrated into the peel-developable imaging medium to provide therein a fracturable release layer interfacially adjacent to a porous or particulate image-forming layer. The fracturable release layer in said imaging medium can be characterized as comprising a cross-linked borated polymeric binder. In another embodiment, the boric acid is added into an image-forming layer formulation, the image-forming layer formulation being then integrated into the peel-developable imaging medium to provide therein a fracturable porous or particulate image-forming layer interfacially adjacent to a release layer. The fracturable porous or particulate image-forming layer in said imaging medium can be characterized as comprising a cross-linked borated polymeric binder. In another embodiment, the polymeric binders of both the image-forming layer and release layer are borated and crosslinked.

Consonant with the objectives of the present invention, the addition of boric acid into a fracturable layer formulation during manufacture of a laminar imaging medium introduces a component into the fracturable layer through which several properties of said fracturable layer can be affected. For example, boric acid can be used to affect or otherwise control the cohesion of and the adhesion between the release layer and the image-forming layer, and thereby, affect the peel strength and/or release strength associated with the development of the laminar imaging medium. In general, however, laminar imaging media contemplated by the present invention can be characterized by enhanced environmental performance, the enhanced environmental performance being achieved without departing from good imaging performance. Embodiments can also be characterized as having enhanced fracture properties leading to structurally improved pel formation and broader pel size ranges.

In general, the inventive aspects of the subject matter described herein subsist in the use of boric acid (or other boric acid generating species) to borate and crosslink a polymeric binder contained in a fracturable layer of a laminar imaging medium. Aside from boric acid, other boric ion generating species include, for example, borax and stable ester salts of boric acid. When polyvinyl alcohol is selected as the binder for a fracturable layer, boric acid, is added in a concentration ranging from greater than 0% to approximately 25% by weight.

The polymeric binder selected for the embodiments of the present invention is most preferably a super-hydrolyzed, high molecular weight polyvinyl alcohol resin. In such embodiments, boric acid will effect intra- and intermolecular hydrogen bonding of the hydroxy groups of the polyvinyl alcohol resin. With no intent to limit the scope of the claims enumerated below, it is believed that the use of a crosslinked borated superhydrolyzed polyvinyl alcohol produces a "crystalline" structure in the image-forming and/or release layers, thereby promoting more brittle fracture and improved pel formation (both in structure of the pels and the resolvable pel size limits). Further, the boration of polyvinyl alcohol reduces the ability of water to occupy hydrogen bonding sites along the backbone of the normally hydrophilic polyvinyl alcohol due to the formation of diborate esters between 1,3-diol sites on the backbone as well as by intermolecular crosslinking effected by formation of triborate esters linking 1,3-diol sites on the backbone of one polyvinyl alcohol molecule with an available —OH group on the backbone of another polyvinyl alcohol molecule. By blocking such water-sensitive functionalities, more balanced and stable release strengths (of, reduced moisture sensitivity) are effected throughout a broad range of environmental conditions.

It will be appreciated that the teaching underlying the herein discussed embodiments may be incorporated into several other peel-developable imaging systems to produce a laminar imaging medium within the scope of the claimed invention. Examples of peel-developable imaging systems may be found in U.S. Pat. No. 5,225,314, issued to Waterman, et at. on Jul. 6, 1993, U.S. Pat. No. 5,200,297, issued to N. F. Kelly on Apr. 6, 1993, U.S. Pat. No. 5,155,003, issued to K. C. Chang on Oct. 13, 1992, and U.S. Pat. No. 5,227,277, issued to Waterman on Jul. 13, 1993. Regardless, to facilitate presentation herein, reference will be made to the thermal imaging medium illustrated in the Figures. The description of this representative embodiment will enable one skilled in the art to make and use the other several embodiments contemplated.

Figure 2:
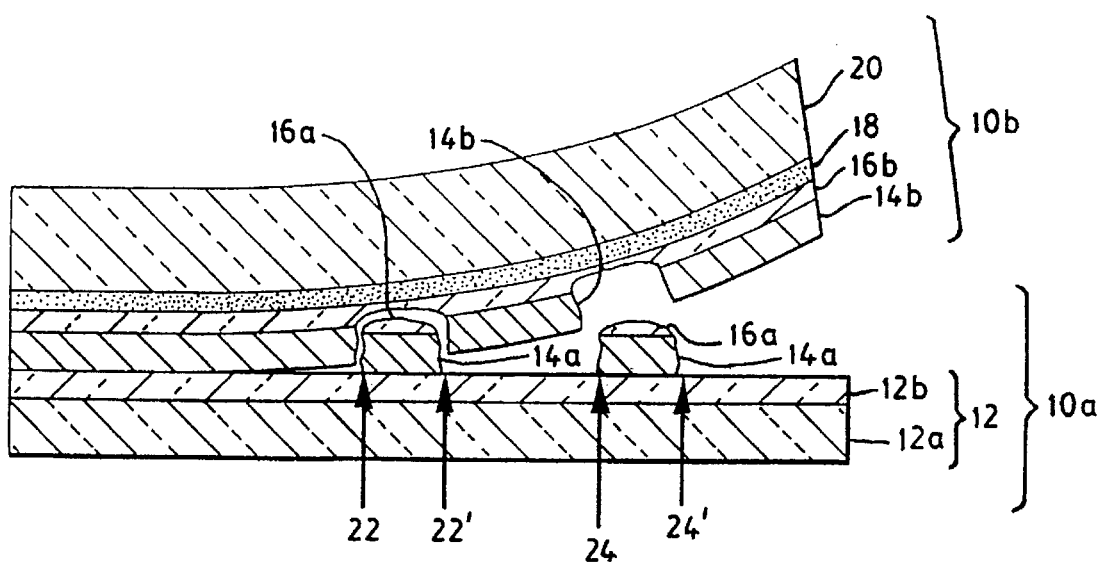
FIG. 2 is a schematic cross-sectional view of the laminar imaging medium illustrated in FIG. 1, the laminar imaging medium being shown in a state of partial laminar separation after imaging.

In FIG. 1, there is shown a laminar imaging medium (generally designated 10) of the present invention suited to production of a pair of high resolution images, shown in FIG. 2 as images 10a and 10b in a partial state of separation. As illustrated in FIG. 1, thermal imaging medium 10 includes a first element in the form of a first sheet-like or web material 12 (comprising sheet material 12a and heat-activatable zone or layer 12b) having superposed thereon, and in order, porous or particulate image-forming layer 14, release layer 16, adhesive layer 18, and second sheet-like or web material 20.

Upon exposure of the medium 10 to, for example, infrared radiation, exposed portions of image-forming layer 14 are more firmly attached to web material 12, so that, upon separation of the image-forming layer of the respective sheet-like materials, as shown in FIG. 2, a pair of images, 10a and 10b, is provided. The nature of certain layers of the layers of thermal imaging medium material 10 and their properties are importantly related to the manner in which the respective images are formed and partitioned from the medium after exposure. The various layers of medium material 10 are described in detail below, attention being initially directed to its fracturable layers, i.e. image-forming layer 14 and release layer 16.

For the production of images of high resolution, it is important that image-forming layer 14 comprise materials that permit fracture through the thickness of the layer and along a direction substantially orthogonal to the interface between surface zone or layer 12b and image-forming layer 14, i.e., substantially along the direction of arrows 22, 22', 24, and 24', shown in FIG. 2. It will be appreciated that, in order for images 10a and 10b to be partitioned in the manner shown in FIG. 2, imaging-forming layer 14 will be orthogonally fracturable as aforedescribed and will have a degree of cohesivity in excess of its adhesivity for heat-activatable zone or layer 12b. Thus, on separation of webs 12 and 20 after imaging, layer 14 will separate in non-exposed areas from heat-activatable layer 12b and remain in exposed areas as porous or particulate portions 14a on sheet or web 12. Layer 14 is an imagewise disruptible layer owing to the porous or particulate nature thereof and the capacity for the layer to fracture or break sharply at particle interfaces.

The image-forming layer 14 according to the representative embodiment is deposited from a formulation comprising an image-forming colorant, a polymeric binder, and boric acid. The image-forming layer formulation is then deposited onto heat-activatable layer 12b and cured to form a porous or particulate layer or coating wherein the polymeric binder is borated and crosslinked.

Layer 14, also referred to as colorant/binder layer, can utilize several colorant materials, the selected colorant being a pigment or dye or any desired color, and preferably, being substantially inert to the elevated temperatures required for thermal imaging of medium 10. Carbon black is a particularly advantageous and preferred pigment material. Preferably, the carbon black material will comprise particles having an average diameter of about 0.01 to 10 micrometers (microns). Aside from carbon black, other optically dense substances, such as graphite, phthalocyanine pigments and other colored pigments can be used. If desired, substances which change their optical density upon subjection to temperatures as herein described can also be considered.

Suitable binder materials for image-forming layer 14, include gelatin, polyvinyl alcohol, hydroxyethyl cellulose, gum arabic, methyl cellulose, polyvinylpyrrolidone, polyethyloxazoline, polystyrene latex and poly(styrene-co-maleic anhydride). In most embodiments envisioned by applicants, the binder material for image-forming layer 14 will be polyvinyl alcohol.

It will be appreciated that polyvinyl alcohol is commercially available in several grades depending on degree of hydrolysis. For example, polyvinyl alcohol having approximately 99.5% (or greater) hydrolysis is oftentimes denoted "superhydrolyzed." Polyvinyl alcohol having approximately 99.0% (or slightly lower or higher) hydrolysis have been termed "film" grade or "fully hydrolyzed." Polyvinyl alcohol with generally less than 90% hydrolysis are typically termed as "partially hydrolyzed." With regard to the varying grades of polyvinyl alcohol, it has been observed that very desirable performance is obtained by the use of superhydrolyzed polyvinyl alcohol. For the purposes of the present invention the term "superhydrolyzed polyvinyl alcohol" should be construed as a high molecular weight polyvinyl alcohol having greater than approximately 99.5% hydrolysis. Regardless of this construction, one skilled in the art will be familiar with and appreciate the meaning of the term "superhydrolyzed."

The ratio of pigment (e.g., carbon black) to binder can be in the range from 40:1 to about 1:2 on a weight basis. Preferably, the ratio of pigment to binder will be in the range of from about 4:1 to about 10:1. A preferred binder material for a carbon black pigment material is polyvinyl alcohol.

In embodiments of the present invention, release layer 16 is designed such that its cohesivity or its adhesion to either adhesive layer 18 or porous or particulate layer 14 is less, in exposed regions, than the adhesion of layer 14 to heat-activated zone or layer 12b. The result of these relationships is that release layer 16 undergoes an adhesive failure in exposed areas at the interface between layers 16 and 18, or at the interface between layers 14 and 16; or as shown in FIG. 2, a cohesive failure of layer 16 occurs, such that portions (16b) are present in image 10b and portions (16a) are adhered in exposed regions to porous or particulate layer 14a. Portions 16a of release layer 16 serve to provide surface protection for the image areas of image 10a, against abrasion or wear.

In certain embodiments, release layer 16 can comprise wax, wax-like, or resinous material. Microcrystalline waxes, for example, high density polyethylene waxes available as aqueous dispersions, can be used for this purpose. Other suitable materials include carnauba, beeswax, paraffin wax, and wax like materials such as poly(vinylstearate), polyethylene sebacate, sucrose polyesters, polyalkylene oxides, and dimethylglycol phthalate. Polymeric or resinous materials such as polyvinyl alcohol, poly(methylmethacrylate), and copolymers of methyl methacrylate and monomers copolymerizable therewith can be employed.

In accord with embodiments of the present invention that incorporate boric acid in release layer 16, the release layer 16 will typically comprise cohesivity-effecting particles and a polymeric binder. Materials suitable for the polymeric binder of the release layer 16 can be selected from the materials used for image-forming layer 14, as set forth above. Control over the cohesivity of release layer 16 is effected by the addition of the particulate materials, whereby release layer 16 is disruptible and can be fractured sharply at the interfaces of particles. Examples of such particulate materials include silica, clay particles, and particles of poly(tetrafluoroethylene).

In the representative embodiment, the web material of layers 12a and 20 comprise a transparent material through which imaging medium 10 can be exposed to radiation. Web material can comprise any of a variety of sheet-like materials, although polymeric sheet materials will be especially preferred. Among preferred sheet materials are polystyrene, poly(ethylene terephthalate), polyethylene, polypropylene, poly(vinyl chloride), polycarbonate, poly(vinylidene chloride), cellulose acetate, cellulose acetate butyrate, and copolymeric materials such as the copolymers of styrene, butadiene, and acrylonitrile, including poly(styrene-co-acrylonitrile). An especially preferred sheet material from the standpoints of durability, dimensional stability, and handling characteristics is poly(ethylene terephthalate), commercially available, for example under the tradename Mylar, of E. I. du Pont de Nemours & Co., Wilmington, Del., or under the tradename Kodel, of Eastman Kodak Company, Rochester, N.Y..

In certain embodiments, a stress-absorbing layer (not shown) may be provided as described in U.S. Pat. No. 5,200,297, issued to N. F. Kelly on Apr. 6, 1993. Briefly, the stress-absorbing layer comprises a polymeric layer capable of absorbing physical stresses applied to the imaging medium 10. The stress-absorbing layer provides added protection against delamination of the medium 10 when rigorous physical stresses are applied thereto, and is desirably formed from a compressible or elongatable polyurethane. The stress-absorbing layer is optional and may sometimes be omitted, depending upon the stresses to which the medium 10 will be subjected.

Heat activatable zone or layer 12b provides an essential function in the imaging medium 10 and comprises a polymeric material which is heat activatable upon subjection of the medium 10 to brief and intense radiation, so that, upon rapid cooling, exposed portions of the surface zone or layer 12b are firmly attached to porous or particulate image-forming layer 14. If desired, as shown in FIGS. 1 and 2, heat-activatable zone or layer 12b can be a surface portion or region of web material 12, in which case, sheet material 12a and heat activatable zone or layer 12b will be of the same or similar chemical composition. In general, it is preferred that heat activatable zone or layer 12b desirably comprise a discrete polymeric surface layer on sheet material 12a or the aforementioned stress-absorbing layer. Layer 12 desirably comprises a polymeric material having a softening temperature lower than that of sheet material 12a, so that exposed portions of image-forming layer 14 can be firmly attached to web material 12. A variety of polymeric materials can be used for this purpose, including polystyrene, poly(styrene-co-acrylonitrile), poly(vinyl butyrate), poly(methyl methacrylate), polyethylene, and poly(vinyl chloride).

The employment of a heat activatable layer 12b on a substantially thicker and durable sheet material 12a permits desired handling of the web material and desired imaging efficiency. The use of a thin heat-activatable layer 12b facilitates the concentration of heat energy at or near the interface between heat-activatable layer 12b and image-forming layer 14 and permits optimal imaging effects and reduced energy requirements. It will be appreciated that the sensitivity of heat-activatable layer 12b to heat activation (or softening) and attachment or adhesion to image-forming layer 14 will depend upon the nature and thermal characteristics of heat activatable layer 12b and upon the thickness thereof.

As can be seen from FIG. 2, the relationship of adhesivity and cohesivity among the several layers of imaging medium 10 are such that separation occurs between layer 14 and heat-activatable zone or layer 12b in non-exposed regions. Thus, imaging medium 10, if it were to be separated without exposure, would separate between heat-activatable zone or layer 12b and layer 14 to provide a $D_{max}$ on sheet 20. The nature of image-forming layer 14 is such, however, that its relatively weak adhesion to heat-activatable zone or layer 12b can be substantially increased upon exposure. Thus, as shown in FIG. 2, exposure of medium 10 to brief and intense radiation in the direction of the arrows and in the areas defined by the respective pairs of arrows, serves in the areas of exposure to substantially lock or attach layer 14, as portions 14a, to heat-activatable zone or layer 12b.

Attachment of weakly adherent image-forming layer 14 to heatactivatable zone or layer 12b in areas of exposure is accomplished by absorption of radiation within the imaging medium and conversion to heat sufficient in intensity to heat activate zone or layer 12b and on cooling to more firmly join exposed regions or portions of layer 14 to heat-activatable zone or layer 12b. Thermal imaging medium 10 is capable of absorbing radiation at or near the interface of heat-activatable zone or layer 12b. This is accomplished by using layers in medium 10 which by their nature absorb radiation and generate the requisite heat for desired thermal imaging, or by including in at least one of the layers, an agent capable of absorbing radiation of the wavelength of the exposing source. Infrared-absorbing dyes can, for example, be suitably employed for this purpose.

Inasmuch as a secure bonding or joining is desired at the interface of layer 14 and heat-activatable zone or layer 12b, it may be preferred in some instances that a light-absorbing substance be incorporated into either or both of image-forming layer 14 (in addition to the image-forming colorant) and heat-activatable zone or layer 12b.

Suitable Hight-absorbing substances in layer 12b (and/or layer 14), for converting light into heat, include carbon black, graphite or finely divided pigments such as the sulfides or oxides of silver, bismuth or nickel. Dyes such as the azo dyes, xanthene dyes, phthalocyanine dyes or the anthraquinone dyes can also be employed for this purpose. Especially preferred are materials which absorb efficiently at the particular wavelength of the exposing radiation. In this connection, infrared-absorbing dyes which absorb in the infrared-emitting regions of lasers which are desirably used for thermal imaging are especially preferred. Suitable examples of infrared-absorbing dyes for this purpose include the alkylpyrylium-squarylium dyes, disclosed in U.S. Pat. No. 4,508,811 (issued Apr. 2, 1985 to D. J. Gravesteijn, et al.), and including 1,3-bis[2,6-di-t-butyl-4H-thiopyran-4-ylidene)methyl]-2, 4-dihydroxy-dihydroxide-cyclobutene diylium-bis{inner salt}. Other suitable IR-absorbing dyes include 4-[7-(4H-pyran-4-ylide)hepta-1,3,5-trienyl]pyrylium tetraphenylborate and 4-[[3-[7-diethylamino-2-(1,1-dimethylethyl)-benz[b]-4H-pyran-4-ylidene)methyl]-2-hydroxy-4-oxo-2-cyclobuten-1-ylidene]methyl]-7-diethylamino-2-(1,1-dimethylethyl)-benz[b]pyrylium hydroxide inner salt. These and other IR-absorbing dyes are disclosed, for example, in U.S. Pat. No. 5,227,499, issued to McGowen et at. on Jul. 13, 1993; and U.S. Pat. No. 5,262,549, issued to Teller et at. on Nov. 16, 1993.

For certain embodiments of the present invention, the aforementioned stress-absorbing layer can be provided on sheet material 12a by the methods described in the aforementioned U.S. Pat. No. 5,200,297. Heat-activatable layer 12b can be provided by resort to known coating methods. For example, a layer of poly(styrene-co-acrylonitrile) can be applied to a web of poly(ethylene terephthalate) by coating from an organic solvent such as methylene chloride. In general, the desired handling properties of web material 12 will be influenced by the nature of sheet material 12a itself, inasmuch as heat-activatable layer 12b (and stress-absorbing layer) will be coated thereon as thin layers. The thickness of web material 12 will depend upon the desired handling characteristics of medium 10 during manufacture and during imaging and post-imaging steps. Thickness will also be dictated in part by the intended use of the image to be carded thereon and by exposure conditions, such as the wavelength and power of the exposing sources. Typically, web material 12 will vary in thickness from about 0.5 to 7 mil (about 13 to 178 μm). Good results are obtained using, for example, a sheet material 12a having a thickness of about 1.5 to 1.75 mils (38 to 40 μm). Stress-absorbing layer will typically have a thickness in the range of about 1 to 4 mm, while heatactivatable layer 12b will typically be a layer of poly(styrene-co-acrylonitrile) having a thickness of about 0.1 to 5 mm.

Heat-activatable layer 12b can include additives or agents providing known beneficial properties. Adhesiveness-imparting agents, plasticizers, adhesion-reducing agents, or other agents can be used. Such agents can be used, for example, to control adhesion between heat-activatable layer 12b and image-forming layer 14, so that undesired separation at the interface thereof is minimized during manufacture of laminar medium 10 or during use thereof in a thermal imaging method or apparatus. Such control also permits the medium, after imaging and separation of sheet like web materials 12 and 20, to be partitioned in the manner shown in FIG. 2.

Thermal imaging medium 10 can be imaged by creating (in medium 10) a thermal pattern according to the information imaged. Exposure sources capable of providing radiation can be imaged onto medium 10, and which can be converted by absorption into a predetermined pattern, can be used. Gas discharge lamps, xenon lamps and lasers are examples of such sources.

As shown in FIGS. 1 and 2, web 20 is provided with an adhesive layer 18, the adhesive layer being utilized to facilitate lamination during manufacture of medium 10. Typically, during manufacture, web 20 carrying adhesive layer 18 will be laminated to the balance of medium 10 carried on web 12 using pressure (or heat and pressure) to provide a unitary lamination. Adhesives of the pressure-sensitive and heat-activatable types can be used for this purpose. Suitable adhesives include poly(ethylene-co-vinyl acetate), poly(vinyl acetate), poly(ethylene-co-ethylacrylate), poly(ethylene-co-methacrylic acid), and polyesters of aliphatic or aromatic dicarboxylic acids (or their lower alkyl esters) with polyols such as ethylene glycol, and mixtures of such adhesives.

The properties of adhesive layer 18 can vary in softness or hardness to suit particular requirements of the laminar medium during manufacture and use and image durability. An adhesive layer 18 of suitable thickness and softness to provide the capability of absorbing stresses that may cause an undesired delamination can be used and can, thus, serve as the stress-absorbing layer of medium 10.

If desired, a hardenable adhesive layer can be used and cutting or other manufacturing operations can be performed prior to the hardening of the layer, as described in International Patent Application No. PCT/US91/08585 of Neal F. Kelly, et at. (published as International Publication No. WO 92/09441).

The exposure of medium 10 to radiation can be progressive or intermittent. For example, a two-sheet laminar medium, as shown in FIG. 1, can be fastened onto a rotating drum for exposure of the medium through web material 12. A light spot of high intensity, such as is emitted by a laser can be used to expose the medium 10 in the direction of rotation of the drum, while the laser is moved slowly in a transverse direction across the web, thereby to trace out a helical path. Laser drivers, designed to fire corresponding lasers, can be used to intermittently fire one or more lasers in a predetermined manner to thereby record information according to an original to be imaged. As shown in FIG. 1, a pattern of intense radiation can be directed onto medium 10 by exposure to a laser from the direction of the arrows 22 and 22' and 24 and 24', the areas between the respective pair of arrows defining regions of exposure.

If desired, a thermal imaging laminar medium of the invention, can be imaged using a moving slit or stencils or masks, and by using a tube or other source which emits radiation continuously and which can be directed progressively or intermittently onto medium 10. Thermographic copying methods can be used, if desired.

Preferably, a laser or combination of lasers is used to scan the medium and record information as very fine dots or pels. Semiconductor diode lasers and YAG lasers having power output sufficient to stay within upper and lower exposure outputs in the range of from about 40 to about 1000 miliwatts. An exposure threshold value, as used herein, refers to a minimal power required to effect an exposure, while a maximum power output refers to a power level tolerable by the medium before "burn out" occurs. Lasers are particularly preferred as exposing sources since medium 10 may be regarded as a threshold-type of film; i.e., it possesses high contrast and, if exposed beyond a certain threshold value, will yield maximum density, whereas no density will be recorded below the threshold value. Especially preferred are lasers which can provide a beam sufficiently fine to provide images having resolution as fine 1,000 (e.g., 4,000 to 10,000) dots per centimeter.

Locally applied heat, developed at or near the interface of layer 14 and surface zone or layer 12b can be intense (about 400° C.) and serves to effect imaging in the manner described above. Typically, the heat will be applied for an extremely short period, preferably of the order of <0.5 microseconds, and exposure time span may be less than one millisecond. For instance, the exposure time span can be less than one millisecond and the temperature span in exposed regions can be between about 100° C. and about 1000° C.

If desired, further protection for the image 10b against abrasion and added durability can be achieved by including an additional layer (not shown) of a thermoplastic material intermediate image-forming layer 14 and surface zone or layer 12b, which additional layer comprises a polymeric disruptible layer fracturable substantially along the exposure direction and which provides surface protective portions (over image portions 14b) for improved durability of image 10b. A laminar thermal imaging medium including a thermoplastic intermediate layer to provide surface protection of an image prepared therefrom is disclosed and claimed in U.S. Pat. No. 5,155,003, issued to K. C. Chang on Oct. 13, 1992.

Alternatively, additional durability can be provided to image 10b by depositing a protective polymeric overcoat layer thereon. A protected image and method therefor are disclosed and claimed in International Patent Application PCTFUS91/08345 of A. F. Fehervari et at. (published on Jun. 11, 1992 as WO 92/09930). A protected reflection image and method therefor are disclosed and claimed in U.S. Pat. App. Ser. No. 08/236,491, filed by J. N. Gordon and G. Teng on Apr. 29, 1994.

The present invention will now be further illustrated with reference to examples. The following examples are presented for purposes of illustrating the invention but are not to be taken as limiting the invention. Measures of percentages and parts are by weight, except where otherwise indicated.

Examples

Example 1

A laminar thermal imaging medium is prepared as follows:

Onto a first sheet of polyethylene terephthalate of 1.75 mil (0.044 mm) thickness are deposited the following layers in succession:

- a 0.7 micron thick stress-absorbing polyurethane layer prepared from 9 parts XR9619 and 1 part R9637 (both of Zeneca Resins, Wilmington, Mass.) and 0.02 parts by weight of ammonium perfluoroalkylsulfonate surfactant (FC 120, Minnesota Mining and Manufacturing, St. Paul, Minn.);
- a 1.0 micron thick heat activatable layer of poly(styrene-co-acrylonitrile) (Tyril 1011, Dow Chemical, Midland, Mich.) dissolved in methyl ethyl ketone;
- a 1.0 micron thick layer composed of carbon black pigment, styrenated acrylate dispersing agent (J67, Johnson Wax Company, Racine Wis.), borated superhydrolyzed polyvinyl alcohol (SH72, Air Products and Chemicals, Allentown, Pa.), 1,4-butanediol diglycidyl ether, and ammonium peffluoroalkylsulfonate surfactant, at ratios, respectively, of 5.683/.5682/1.0/.18/.003;
- a 1.0 micron thick release layer comprising colloidal silica, styrenated acrylate latex particles (J87, Johnson Wax Co.), partially hydrolyzed polyvinyl alcohol (Vinol 540, Air Products), poly(vinyl methyl ether co-maleic anhydride) (Gantrez S97, GAF Corp., Culver City, Ky.), and a 3 to 1 blend of polyethylene oxide dimethyl siloxane copolymer surfactants (Silwet L7607, L7605, Union Carbide, Sisterville, W. Va.) at respective ratios of 1.4/1.0/.10/.02/.017;

a 3.6 micron thick bridge layer of a copolymer of vinylidene chloride (90%) and methylacrylate (10%) (Daran SL159, WR Grace Company) and FC120 surfactant at a ratio of 28 to 0.02.

Onto a second sheet of polyethylene terephthalate, of seven-mil (0.178 mm) thickness, is coated a layer of ultraviolet (UV) curable adhesive. The UV-curable adhesive is formulated by adding 70 parts of trimethylolpropane triacrylate monomer (TMPTA), available as Sartomer 351 from Sartomer Company, West Chester, Pa., to a solution containing: 50 parts poly(methylmethacrylate-co-isobutylmethacrylate) (Elvacite 2045, E. I. duPont de Nemours and Company), 180 parts of a 50% solution of butylmethacrylate polymer (Doresco AC102-19, Dock Resin Company); 14 parts 2,2-dimethoxy-2-phenylacetophenone initiator (Irgacure 651, Ciba-Geigy Corp.); 0.1 part methoxyhydroquinone inhibitor; 0.35 part tetrakis{methylene(3,5-di-tert-butyl-4-hydroxyhydrocinnamate)}methane (Irganox 1010, Ciba-Geigy Corp.); and 0.35 part thiodiethylene bis(3,5-di-tert-butyl-4-hydrohydrocinnamate) (Irganox 1035, Ciby-Geigy Corp.). The formulation is dissolved in a solvent blend of 791 parts ethylacetate and 29.8 parts methyl ethyl ketone.

The first and second polyethylene terephthalate sheets, upon coating and drying in hot forced air ovens, are brought together with their coated surfaces in face-to-face contact, the seven-mil sheet being in contact with a rotating steel drum (maintained at approximately 38° C.) and the 1.75-mil sheet being in contact with a rubber backing roll. The resulting laminated web is wound onto a take-up roll with the 1.75-mil web material outermost and held for a period of one hour in this configuration. The web is then unwound and passed in a flattened configuration through a radio frequency powered source of ultraviolet radiation, with the 7-mil sheet facing the UV source, with sufficient ultraviolet flux to effect curing of the ultraviolet adhesive layer, then rewound with the 1.75-mil material outermost. The laminar material is unwound to a slitting station where edgewise trimming of the medium is performed in the machine direction. The laminar medium is thermally bordered using a heating platen in the shape of a desired final perimeter edge configuration for individual sheet units. The platen is applied onto the web to thereby effect adhesion of the carbon containing layer to the heat activated layer. The laminar medium is punch-cut into individual sheet units. As an alternative to heated platens, the laminar medium may be thermally bordered by utilizing laser irradiation to effect radiative transfer of energy to the carbon black containing layer. Reference may be had to U.S. Pat. App. Ser. No. 07/981,287 (allowed) for further disucussion of thermal bordering.

Individual units of laminar medium (prepared as described) are imaged by laser exposure through the 1.75-mil polyester sheet side using high intensity semiconductor lasers. In each case, the laminar medium is damped onto a rotary drum with the 1.75-mil side facing away from the drum. Irradiation from the semiconductor lasers is directed through the 1.75-mil polyester sheet thereof in an imagewise manner. After imagewise exposure, the laminar medium is removed from the rotary drum and the respective sheets of the laminar medium are separated to provide a first image on the 1.75-mil polyester sheet and a second (and complementary) image on the second polyester sheet (7-mil).

Example 2

A laminar thermal imaging medium is prepared in the manner described in Example 1, except that the following formulation is employed in the release layer:

a 1.0 micron thick layer comprising colloidal silica, styrenated acrylate latex particles (J87, Johnson Wax Co.), borated super-hydrolyzed polyvinyl alcohol (SH72, Air Products), and a 3 to 1 blend of polyethylene oxide dimethyl siloxane copolymer surfactants (Silwet L7607, L7605, Union Carbide, Sisterville, W. Va.) at respective ratios of 1.4/1.0/.125/.017;

Individual units are coated, laminated, cured, slit, formatted, imaged and separated in the manner described in Example 1 to provide first and second images on the respective sheets thereof.

Reference Example

A laminar thermal imaging medium is prepared in the manner described in Example 1, except that the carbon containing layer is formulated as follows:

a 1.0 micron thick layer composed of carbon black pigment, styrenated acrylate dispersing agent (J67, Johnson Wax Company, Racine, Wis.), partially hydrolyzed polyvinyl alcohol (Vinol 540, Air Products and Chemicals, Allentown, Pa.), 1,4-butanediol diglycidyl ether, and ammonium perfluoroalkylsulfonate surfactant, at ratios, respectively, of 5.682/. 5682/1.0/. 18/.003;

Individual units are coated, laminated, cured, slit, formatted, imaged, and separated in the manner described in Example 1 to provide first and second images on the respective sheets thereof.

Evaluation

Samples prepared as described above were evaluated. In this regard, it will be noted that one measure of fracture control in the formation of imaging patterns is referred to as 'pel quality'. The assessment of pel quality can be made by examining the microscopic structure of the resultant imaging pattern recorded onto the media. In cross-sections this structure may be viewed as a 2dimensional spatial pattern. A desirable imaging medium will resolve this pattern with complete fidelity and would reveal very sharp edges in both axes and very sharp 90 degree comers, e.g., precisely shaped rectangles. Visual observations of the media samples were quantified on a scale ranging from 10 (perfect pel fidelity) to 1 (extremely poor edges, misshapen comers and disrupted and missing image details). Independent assessments were also made for the sharpness and straightness of perimeter edges and for the sharpness and lack of roundness in corners.

The resolving power of the media was evaluated by considering the smallest repeatable areas which can be written and resolved, i.e., $D_{max}-1$. As used in the Table below, $D_{max}-1$ is defined as the optical density of a uniform field of smallest attainable holes on a 7-mil sheet ('smallest attainable' being defined as 95 percent of holes present in a given area) as viewed with a 30x eyepiece on a fluorescent backlit lightbox.

The robustness of the imaging media was evaluated by considering their "environmental stability" (i.e., their overall imaging quality variations due to temperature and humidity changes in storage environment) and "shelf-life" (i.e., the relative change in performance as a function of controlled environmental storage over time).

Results of the evaluations are summarized in Table 1, below.

TABLE 1

| Example | Pel Quality | Edge Sharpness | Corner Sharpness | $D_{max}-1$ O.D. | Environmental Stability* | Shelf Life* |
|---|---|---|---|---|---|---|
| 1 | 9 | 9 | 9 | 3.03 | B | B |
| 2 | 8 | 8 | 7 | 3.12 | A | A |
| Reference | 5 | 6 | 5 | 2.85 | C | C |

*Comparatively measured with "C" being the performance of the Reference Example (cf, similar, no improvement).

As construed from Table 1, Examples 1 and 2 show good pel formation quality in both edges and corners as well as good dynamic range in maximum attainable $D_{max}-1$ density. As suggested by the results of Example 2, the use of borated superhydrolyzed PVA in both the carbon imaging layer as well as the release layer imparts improved environmental stability and excellent shelf life properties.

Example 3

It will be appreciated that to incorporate a boric ion generating species into a fracturable layer of an imaging medium, practice of the present invention does not require the use of a previously synthesized borated polyvinyl alcohol. The boric ion generating species may be incorporated, as in this example, by addition of boric acid into the formulation of the respective fracturable layer(s). Accordingly, a laminar thermal imaging medium is prepared in the manner described in Example 1, except that the following formulations are employed in the carbon containing and release layer:

- a 1.0 micron thick layer prepared from carbon black pigment, styrenated acrylate dispersing agent (J67, Johnson Wax Company, Racine, Wis.), superhydrolyzed polyvinyl alcohol (A165, Air Products and Chemicals, Allentown, Pa.), boric acid, 1,4-butanediol diglycidyl ether, and ammonium perfluoroalkylsulfonate surfactant, at ratios, respectively, of 5.682/.5682/ 1.0/.09/. 18/.003;
- a 1.0 micron thick release layer comprising colloidal silica, styrenated acrylate latex particles (J87, Johnson Wax Co.), superhydrolyzed PVA (A165, Air Products), boric acid, and a 3 to 1 blend of polyethylene oxide dimethyl siloxane copolymer surfactants (Silwet L7607, L7605, Union Carbide, Sisterville, W. Va.) at respective ratios of 1.4/1.0/.10/.009/.017;

Individual units are coated, laminated, cured, slit, formatted, imaged, and separated in the manner described in Example 1 to provide first and second images on the respective sheets thereof.

We claim:

1. A laminar imaging medium for the imagewise recordation of information, the recorded latent image being developable by laminar separation, said laminar imaging medium comprising:

first and second support sheets;

an imagewise activatable polymeric layer, the imagewise activatable layer being activatable in response to an imagewise recordation to thereby increase adhesion between said layer and a porous or particulate image-forming layer;

a plurality of fracturable layers, the plurality comprising the porous or particulate image-forming layer and a release layer, at least one of the fracturable layers having a cross-linked borated polymeric binder;

the porous or particulate image-forming layer disposed on the imagewise activatable layer and forming an interface therewith, the image-forming layer having cohesivity in excess of its adhesivity for the imagewise activatable layer;

the release layer disposed on the image-forming layer and forming an interface therewith such that upon laminar separation of the laminar imaging medium following activation of areas of the laminar imaging medium failure occurs in areas corresponding to the imagewise recordation within or on the surface of the release layer; and the first support sheet secured to the imagewise activatable layer and the second support sheet adhered to the face of the release layer remote from the imagewise activatable layer.

2. The laminar imaging medium of claim 1, wherein the crosslinked borated polymeric binder is present in the porous or particulate image-forming layer.

3. The laminar imaging medium of claim 1, wherein the cross-linked borated polymeric binder is present in the release layer.

4. The laminar imaging medium of claim 1, wherein the cross-linked borated polymeric binder is a crosslinked borated polyvinyl alcohol.

5. The laminar imaging medium of claim 4, wherein the crosslinked borated polyvinyl alcohol is a crosslinked borated superhydrolyzed polyvinyl alcohol.

6. A laminar imaging medium for the imagewise recordation of information, the recorded latent image being developable by laminar separation, said laminar imaging medium comprising:

first and second support sheets;

an imagewise activatable polymeric layer, the imagewise activatable layer being activatable in response to an imagewise recordation to thereby increase adhesion between said layer and a porous or particulate image-forming layer;

a plurality of fracturable layers, the plurality comprising the porous or particulate image-forming layer and a release layer, at least one of the fracturable layers having incorporated therein a boric ion generating material;

the porous or particulate image-forming layer disposed on the imagewise activatable layer and forming an interface therewith, the image-forming layer having cohesivity in excess of its adhesivity for the imagewise activatable layer;

the release layer disposed on the image-forming layer and forming an interface therewith such that upon laminar separation of the laminar imaging medium following activation of areas of the laminar imaging medium failure occurs in areas corresponding to the imagewise recordation within or on the surface of the release layer; and the first support sheet secured to the imagewise activatable layer and the second support sheet adhered to the face of the release layer remote from the imagewise activatable layer.

7. The laminar imaging medium of claim 6, wherein the boric ion generating material is boric acid.

8. The laminar imaging medium of claim 7, wherein the boric acid is incorporated into the porous or particulate image-forming layer.

9. The laminar imaging medium of claim 8, wherein the image-forming layer further comprises a superhydrolyzed polyvinyl alcohol.

10. The laminar imaging medium of claim 7, wherein the boric acid is incorporated into the release layer.

11. The laminar imaging medium of claim 10, where the release layer further comprises a superhydrolyzed polyvinyl alcohol.

* * * * *